(12) United States Patent
Shalaev et al.

(10) Patent No.: US 11,802,921 B2
(45) Date of Patent: Oct. 31, 2023

(54) NANODEVICE, METHOD OF MAKING THE SAME, AND METHOD OF USING THE SAME

(71) Applicant: Purdue Research Foundation, West Lafayette, IN (US)

(72) Inventors: Vladimir M. Shalaev, West Lafayette, IN (US); Pramey Upadhyaya, West Lafayette, IN (US); Abhishek Bharatbhai Solanki, West Lafayette, IN (US); Simeon I. Bogdanov, Champaign, IL (US); Yong P. Chen, West Lafayette, IN (US); Mohammad Mushfiqur Rahman, West Lafayette, IN (US); Avinash Rustagi, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 1 day.

(21) Appl. No.: 17/538,007

(22) Filed: Nov. 30, 2021

(65) Prior Publication Data

US 2022/0171000 A1  Jun. 2, 2022

Related U.S. Application Data

(60) Provisional application No. 63/119,041, filed on Nov. 30, 2020.

(51) Int. Cl.
*G01R 33/02* (2006.01)
*H10N 50/80* (2023.01)
*H10N 50/85* (2023.01)

(52) U.S. Cl.
CPC ............ *G01R 33/02* (2013.01); *H10N 50/80* (2023.02); *H10N 50/85* (2023.02)

(58) Field of Classification Search
None
See application file for complete search history.

(56) References Cited

PUBLICATIONS

Demonstration of a pseudo-magnetization based simultaneous write and read operation in a Co60Fe20B20/Pb(Mg1/3Nb2/3)0.7Ti0.3O3 heterostructure, Shen et al. (Year: 2020).*
Electrical control of coherent spin rotation of a single-spin qubit to Wang et al. (Year: 2020).*
Andrich, P. et al., Long-range spin wave mediated control of defect qubits in nanodiamonds. npj Quantum Information 3, 28 (2017).
(Continued)

*Primary Examiner* — Douglas X Rodriguez
(74) *Attorney, Agent, or Firm* — Purdue Research Foundation

(57) ABSTRACT

A nanodevice provides for electric-field control of magnon-QSD interactions. The nanodevice includes a ferroelectric substrate, a ferromagnetic material disposed over the ferroelectric substrate, and a nanodiamond including an ensemble of nitrogen-vacancy (NV) spins, each NV magnetically interfacing with the ferromagnetic material. An electric field is measured by applying a voltage across the ferroelectric substrate and the ferromagnetic material, changing a magnon excitation spectrum of the ferromagnetic material with respect to an electron spin resonance frequency of the ensemble of NV spins, and measuring a relaxation rate of the ensemble of NV spins.

20 Claims, 7 Drawing Sheets

(56) References Cited

PUBLICATIONS

Kikuchi, D. et al., Long-distance excitation of nitrogen-vacancy centers in diamond via surface spin waves, Appl. Phys. Express 10, 103004 (2017).
Trifunovic, L. et al., Long-Distance Entanglement of Spin Qubits via Ferromagnet, Phys. Rev. X 3, 041023 (2013).
Flebus, B. et al., Entangling distant spin qubits via a magnetic domain wall, Phys. Rev. B 99, 140403(R) (2019).
Trifunovic, L. et al., High-efficiency resonant amplification of weak magnetic fields for single spin magnetometry at room temperature. Nature Nanotechnology, 10, 541 (2015).
Van Der Sar, T. et al., Nanometre-scale probing of spin waves using single electron spins. Nature Communications, 6, 7886 (2015).
Page, M. et al., Optically detected ferromagnetic resonance in diverse ferromagnets via nitrogen vacancy centers in diamond. J. Appl. Phys. 126, 124902 (2019).
Labanowski, D. et al., Voltage-driven, local, and efficient excitation of nitrogen-vacancy centers in diamond. Sci. Adv. 4, eaat6574 (2018).
Kurizki, G. et al., Quantum technologies with hybrid systems. Proc. Natl. Acad. Sci. USA 112, 3866 (2015).
Awschalom, D.D. et al., Quantum engineering with hybrid magnonics systems and materials, IEEE Trans. Quantum Eng. 2, 1 (2021).
Wang, X. et al., Electrical control of coherent spin rotation of a single-spin qubit. npj Quantum Information 6, 78 (2020).
Laucht, A. et al., Electrically controlling single-spin qubits in a continuous microwave field. Sci. Adv. 1, e1500022 (2015).
Zhang, S. et al., Giant electrical modulation of magnetization in Co40Fe40B20/Pb(Mg1/3Nb2/3)0.7 Ti0.3O3 (011) heterostructure. Scientific Reports, 4, 3727 (2014).
Shen, T. et al., Demonstration of a psuedo-magnetization based simultaneous write and read operation in a Co60Fe20B20/Pb(Mg1/3Nb2/3)0.7Ti0.3O3 heterostruture, Scientific Reports, 10, 10791 (2020).
Dolde, F. et al., Electric-field sensing using single diamond spins. Nature Physics, 7, 459 (2011).
Franson, A. et al., Low-damping ferromagnetic resonance in electron-beam patterned, high-Q vanadium tetracyanoethylene magnon cavities. APL Materials, 7, 121113 (2019).
Yusuf, H. et al., Exploring a quantum-information-relevant magnonic material: Ultralow damping at low temperature in the organic ferrimagnet V[TCNE]x, AVS Quantum Sci. 3, 026801 (2021).
Kurfman, S. et al., Electric-field control of strain-driven tuning of FMR in the low-loss ferrimagnetic coordination compound V[TCNE]x, Bulletin of the American Physical Society, PAS March Meeting 2021, vol. 66, No. 1 (2021).

\* cited by examiner

NANODEVICE, METHOD OF MAKING THE SAME, AND METHOD OF USING THE SAME

CROSS-REFERENCE TO RELATED APPLICATIONS

This application is related to and claims the priority benefit of U.S. Provisional Patent Application No. 63/119,041, entitled "Nanodevice, Method of Making the Same, and Method of Using the Same," filed Nov. 30, 2020, the contents of which are hereby incorporated by reference in their entirety into the present disclosure.

GOVERNMENT SUPPORT CLAUSE

This invention was made with government support under contract number DMR1838513 and ECCS1944635 awarded by National Science Foundation and under contract number DE-AC05-00OR22725 awarded by the Department of Energy. The government has certain rights in the invention.

TECHNICAL FIELD

The present application relates to nanodevices, and specifically to systems and methods for electrically tunable quantum spintronic nanodevices.

BACKGROUND

This section introduces aspects that may help facilitate a better understanding of the disclosure. Accordingly, these statements are to be read in this light and are not to be understood as admissions about what is or is not prior art.

Nitrogen-vacancy (NV) centers of nanodiamonds are point defects in the diamond lattice, which consist of a substitutional-nitrogen atom adjacent to a lattice vacancy. They possess nonzero electron spin (S=1) and can be optically initialized and read out, which allows numerous applications including electric-field, magnetic-field, pressure, and temperature sensing, as well as nanoscale nuclear magnetic resonance (NMR). Nanodiamonds containing NV centers are non-toxic, photostable, and can be easily functionalized, meaning they can be used in a wide variety of applications.

Magnons, the quanta of spin-wave excitations in magnetically ordered systems, have recently attracted interest with the promise of reducing ohmic-dissipation in classical information processing and communication. Accordingly, there has been growing interest in coupling magnons with various existing quantum platforms, such as superconducting qubits and spin qubits, which have therefore extended the reach of magnonics to the quantum domain. Magnons interfaced with quantum spin defects (QSD) have emerged as a promising platform for building hybrid quantum systems. The motivation for creating these hybrid systems is two-fold. First, magnons resonantly enhance microwave fields up to the nanoscale, providing efficient control fields for realizing on-chip coherent driving and communication between QSD qubits. As of today, such QSD-based integrated device functionality has been primarily explored via phonon-induced strain fields and microwave photon-generated electromagnetic fields. Magnons feature non-reciprocal transport (such as, occurring naturally in thin magnetic films), channeling, and mode confinement at reconfigurable magnetic textures (e.g., domain walls and skyrmions), as well as superior scalability for higher frequency operation. This could enable functionalities complementary to those offered by phonons and photons. Second, application of well-established quantum defect magnetometry techniques to magnon-generated fields can provide means to create magnetic field sensors with improvement in their sensitivities and to develop previously unavailable non-invasive nanoscale probes for advancing spintronics.

To exploit the QSD-magnon hybrids, it is important to tune the interaction between magnons and QSDs locally and with minimal heating. Control of magnon-QSD interaction may primarily be achieved via tuning an applied magnetic field, or by a current-induced spin-orbit torque. The control magnetic field is challenging to localize at the nanoscale, while use of electric current generates Joule heating and thus negatively affects quantum coherence. Electric fields provide a promising alternative, as they can be confined to the scale of inter-qubit separation with minimal Joule heating. On the technological front, such an ability would provide alternative means to enable a network of QSD-qubits where the desired spins are driven or entangled with their neighbors using tunable magnon modes. Accordingly, QSD-based scalable quantum platforms are desired.

SUMMARY

The present disclosure includes aspects which can allow demonstrations of electric-field control of magnon-QSD interaction through engineering of a new hybrid nanodevice system. The nanodevice system can combine a ferroelectric-ferromagnetic multiferroic with QSDs. While electric-field control of magnetism in such composite multiferroics has garnered attention in the classical domain, the present disclosure can provide for their utility for engineering functional quantum hybrids.

Magnons can generate microwave fields at the nanoscale, whose efficient coupling with quantum spin defects can be a viable resource for controlling defect-qubits and develop versatile probes for magnetism. Tuning this coupling via electric fields can provide alternate methods for addressing the challenges of enhancing defect spin-based sensing of electric fields and coherently manipulating defect-qubits locally, with minimal power. The present disclosure demonstrates new approaches to achieve electric field tuning by providing hybrid systems that can integrate ferromagnet-ferroelectric multiferroic films with NV center spins. Combining NV-spin relaxometry with ferromagnetic resonance measurements can reveal that the observed modulation results from the ferroelectric polarization control of magnetic anisotropy, which, can be utilized to tune the magnon-generated microwave fields at the NV. Specifically, in some aspects as described herein, reversing the ferroelectric polarization can change the NV-spin relaxation rate by 400% or more, which can therefore be enhanced by multiple orders of magnitude such as by patterning the ferromagnets. Accordingly, aspects of the present disclosure can improve NV-sensing of electric fields, create electric-field-tunable quantum spintronic devices, and develop single spin probes of the multiferroic order, among other advantageous improvements.

BRIEF DESCRIPTION OF THE DRAWINGS

While the specification concludes with claims which particularly point out and distinctly claim this technology, it is believed this technology will be better understood from the following description of certain examples taken in conjunction with the accompanying drawings, in which like reference numerals identify the same elements and in which:

Figure 1A:
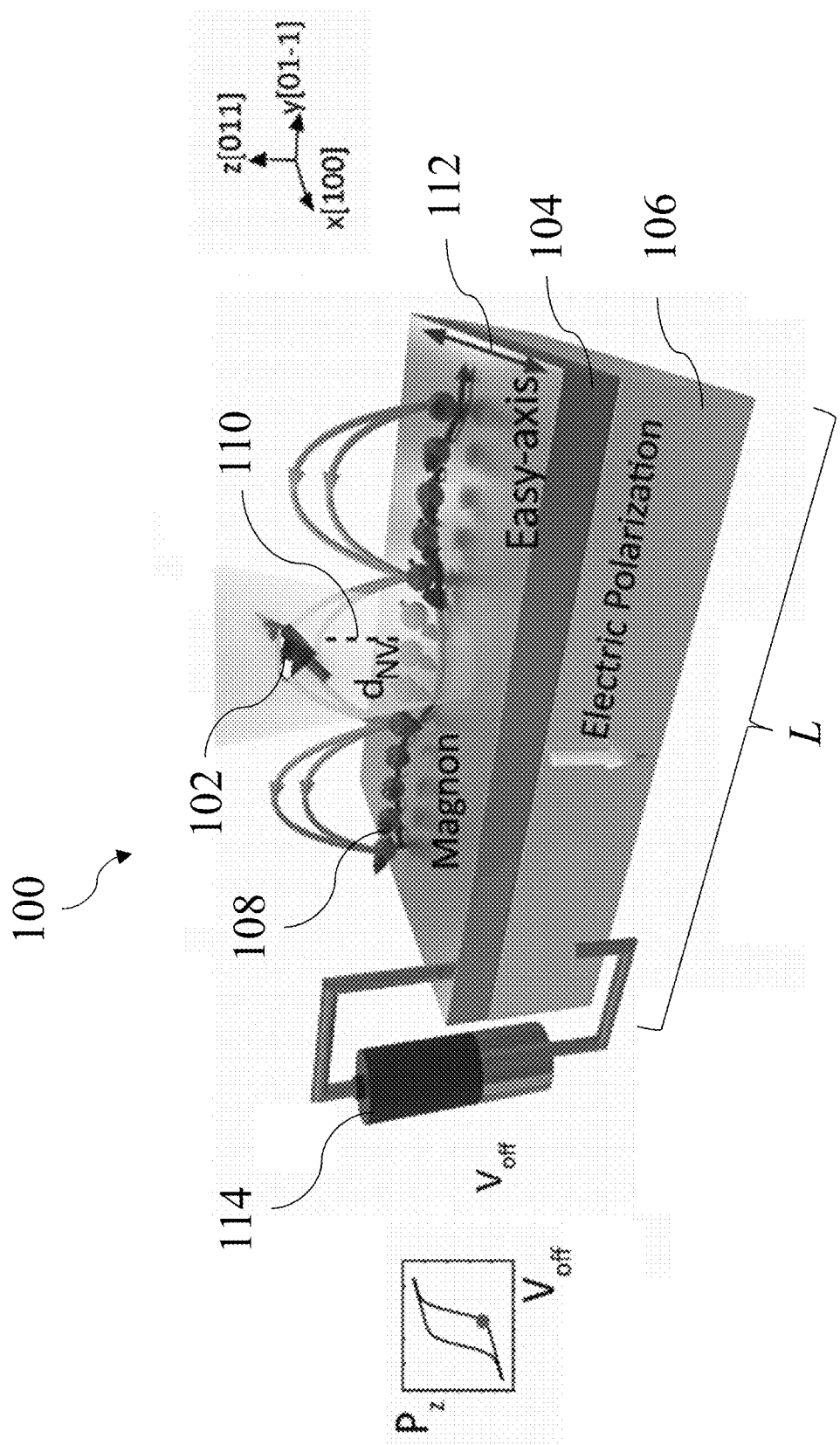
FIG. 1A depicts one exemplary nanodevice assembly, showing a voltage source providing a voltage signal to a nanodevice, the voltage signal providing a first polarization state.

The drawings are not intended to be limiting in any way, and it is contemplated that various embodiments of the technology may be carried out in a variety of other ways, including those not necessarily depicted in the drawings. The accompanying drawings incorporated in and forming a part of the specification illustrate several aspects of the present technology, and together with the description serve to explain the principles of the technology; it being understood, however, that this technology is not limited to the precise arrangements shown, or the precise experimental arrangements used to arrive at the various graphical results shown in the drawings.

DETAILED DESCRIPTION

The following description of certain examples of the technology should not be used to limit its scope. Other examples, features, aspects, embodiments, and advantages of the technology will become apparent to those skilled in the art from the following description, which is by way of illustration, one of the best modes contemplated for carrying out the technology. As will be realized, the technology described herein is capable of other different and obvious aspects, all without departing from the technology. Accordingly, the drawings and descriptions should be regarded as illustrative in nature and not restrictive.

It is further understood that any one or more of the teachings, expressions, embodiments, examples, etc. described herein may be combined with any one or more of the other teachings, expressions, embodiments, examples, etc. that are described herein. The following-described teachings, expressions, embodiments, examples, etc. should therefore not be viewed in isolation relative to each other. Various suitable ways in which the teachings herein may be combined will be readily apparent to those of ordinary skill in the art in view of the teachings herein. Such modifications and variations are intended to be included within the scope of the claims.

I. Overview

The dependence of magnon-spin coupling on an electric field, when combined with the magnetometry of magnon-generated fields, can provide a new method for sensing electric fields via QSDs—a functionality which is of interest to study a broad range of nanoscale electric phenomena at the interface of fundamental and applied science. In some versions, an electric field vector may be determined, while in other versions only an electric field magnitude may be determined. Some sensing schemes face challenges, such as those which rely on direct coupling of electric fields to ground or excited states of QSDs. The ground states of the dominant QSD sensor—nitrogen-vacancy (NV) center in nanodiamonds—can exhibit weak susceptibilities to electric fields, therefore limiting their sensitivity. Whereas, while the excited state schemes can improve electric field susceptibility by nearly two orders of magnitude, the excited state schemes suffer from photoionization of local charge traps and/or are limited to low-operating temperatures. The transduction of electric fields to a magnetic signal via magnons could allow one to exploit the stronger magnetic field susceptibility of QSD ground states and could thus provide a route to overcome these challenges.

FIG. 1A depicts a nanodevice (100) having a nanodiamond (102) with one or more NV center ensembles (not shown), each of which being configured to act as QSDs, onto ferromagnetic (FM) (104) and ferroelectric (FE) (106) composite multiferroic films. It should be understood that, while one nanodiamond is illustrated, a plurality of nanodiamonds may be arranged along or adjacent to the composite including the FM film (104) and FE film (106) described herein. One example of a FM film (104) that may be utilized as described herein is a CoFeB/(011-cut) film. Further, one example of a FE film (106) that may be utilized as described herein is a lead magnesium niobate-lead titanate (PMN-PT) film. However, while CoFeB and PMN-PT are respectively described throughout this disclosure, it should be understood that other materials having similar properties may instead be utilized. In some versions, the nanodiamond is sized approximately 70 nanometers (nm) in all dimensions. Also, in some versions, the ensembles of NV centers are dispersed on a thin ferromagnetic film of CoFeB that is deposited on an approximately 300 μm thick PMN-PT ferroelectric substrate. A power supply (114) can provide a voltage signal to switch the electrical polarization of the FE substrate (106) (as shown in schematic P-V loops), which may result in lattice strain represented by the exaggerated change in lateral dimensions (L) of the nanodevice assembly structure represented by FIG. 2A as compared to FIG. 1A. Specifically, the strain may be transferred to the CoFeB film, changing its magnetic anisotropy. The direction of the magnetic anisotropy field (the "easy-axis" (112)) is along x-axis for $V=V_{off}$ and along y-axis for $V=V_{on}$ in CoFeB.

The magnons (108) of the FM film (104) are configured to produce oscillating dipole magnetic fields at the NV, whose magnitude and frequencies ($\omega_m$) depend on their wavevector (k)[7]. These oscillating dipole magnetic fields are configured to mediate the interaction of the magnons (108) with the NV-spins via Zeeman coupling. The coupling mediated by the dipolar field components that are transverse to the NV-spin quantization axis (110) are of particular interest. This transverse interaction, by interconverting between the magnons (108) and the electron spin resonance (ESR) transitions hosted within the NV of the nanodiamond (102), can form the basis for quantum devices and sensors based on magnon-QSD hybrid systems. By controlling the ferroelectric polarization component $P_z$ along the [011] axis (see, FIG. 1A) of the FE film (106), the magnon bands (108) of the FM film can be moved with respect to the NV ESR transitions. Accordingly, magnon-generated fields of different magnitude in resonance with the NV ESR transitions can be created, thereby enabling electric-field control of the transverse interaction between QSDs and magnons (108).

As shown in FIG. 1A, the magnon bands (108) respond to the reversal of $P_z$ from the −z to +z direction in the presence of a fixed external magnetic field ($H_{ext}$) along the [100] x-axis (see, FIG. 1A). The reversal of $P_z$ is initiated at $V=V_{off}$, where the magnon bands (108) and NV ESR transitions are off-resonant, giving rise to a weak coupling therebetween. In contrast, for $V=V_{on}$, as shown in FIG. 2A, the reversal is nearly completed, and the magnon bands (108) and NV ESR transitions are brought into resonance, giving rise to a stronger coupling therebetween. Such movement of magnon bands (108) results from the coupled electric, elastic, and magnetic orders in the multiferroic substrate (i.e., the combination of the FM substrate (104) and the FE substrate (106). More specifically, the (011)-cut (see, FIG. 1A) FE substrate (106) features piezoelectric coefficients $d_{31}$ and $d_{32}$ of opposite signs. Consequently, to accommodate the increasing $P_z$, the FE substrate (106), in this example PMN-PT, expands along the [01-1] y-axis (see, FIG. 1A) and shrinks along the [100] x-axis (see, FIG. 1A). The transfer of this anisotropic strain to the FM substrate (104), in this example CoFeB, when combined with the magnetoelastic interaction, lowers energy for the magnetization oriented along the y-axis and raises energy for the magnetization oriented along the x-axis (see, FIG. 1A). This change in the electric polarization-controlled uniaxial magnetic anisotropy results in the easy-axis (112) reorienting from x to y for $P_z$ changing from −z to +z. As such, both the magnon band gap $\Delta \equiv \omega_m$ (k=0) and hence the frequency range spanned by the magnon bands (108) can depend on the magnetic anisotropy. The alignment of the direction of $H_{ext}$ with the easy axis (112) maximizes $\Delta$, while the orthogonal orientation minimizes $\Delta$. Consequently, as the voltage is adjusted from $V_{off}$ to $V_{on}$, the magnon bands (108) may be pulled to lower frequencies and brought into resonance with the NV ESR transitions (see, for example, FIGS. 1B and 2B).

Figure 1C:
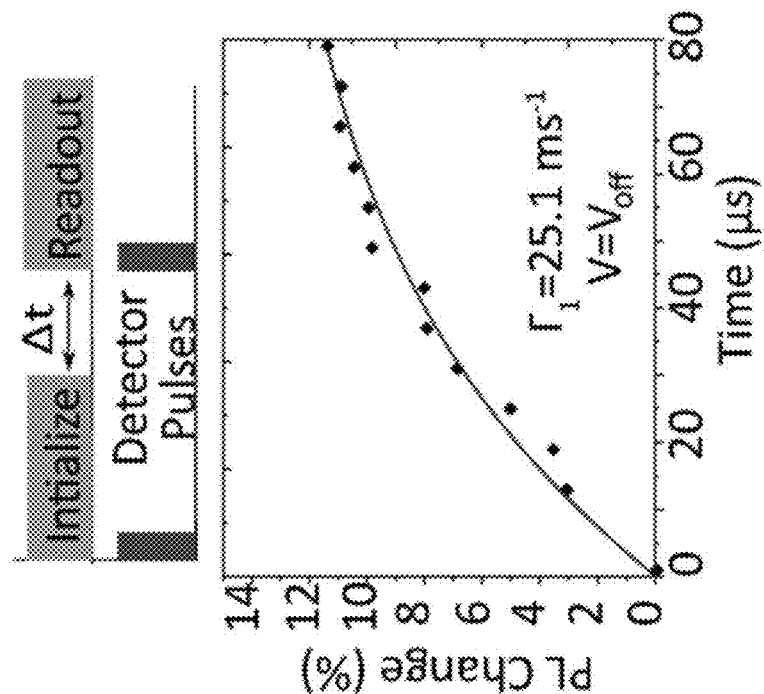
FIG. 1C depicts a graphical representation of experimental results showing the change in relaxation rates of the NV ensemble of the nanodiamond of the nanodevice assembly of FIG. 1A as enabled by electrical tuning of QSD-magnon coupling.
Figure 1B:
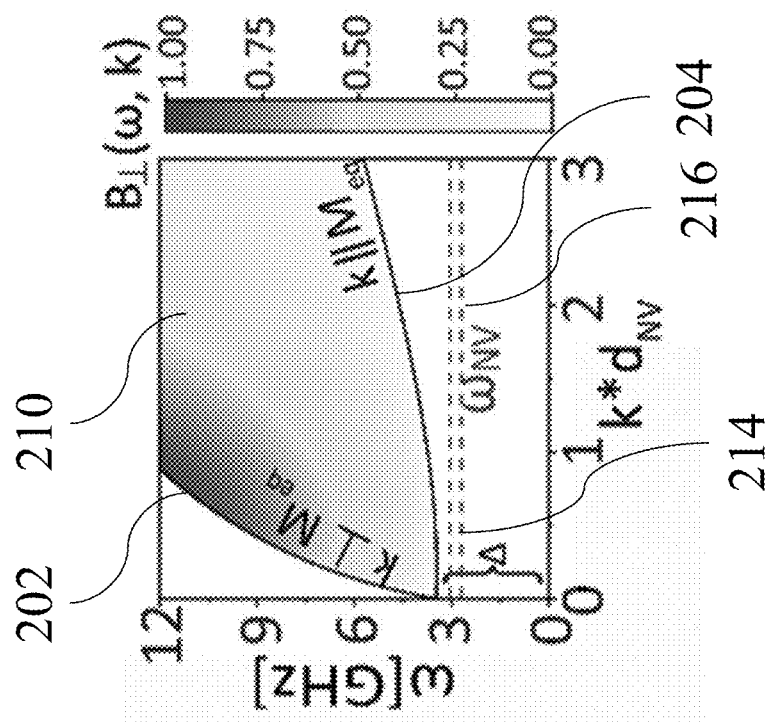
FIG. 1B depicts a graphical representation of experimental results for normalized B⊥(k) as a function of (ω-k) for the nanodevice assembly of FIG. 1A.
Figure 2A:
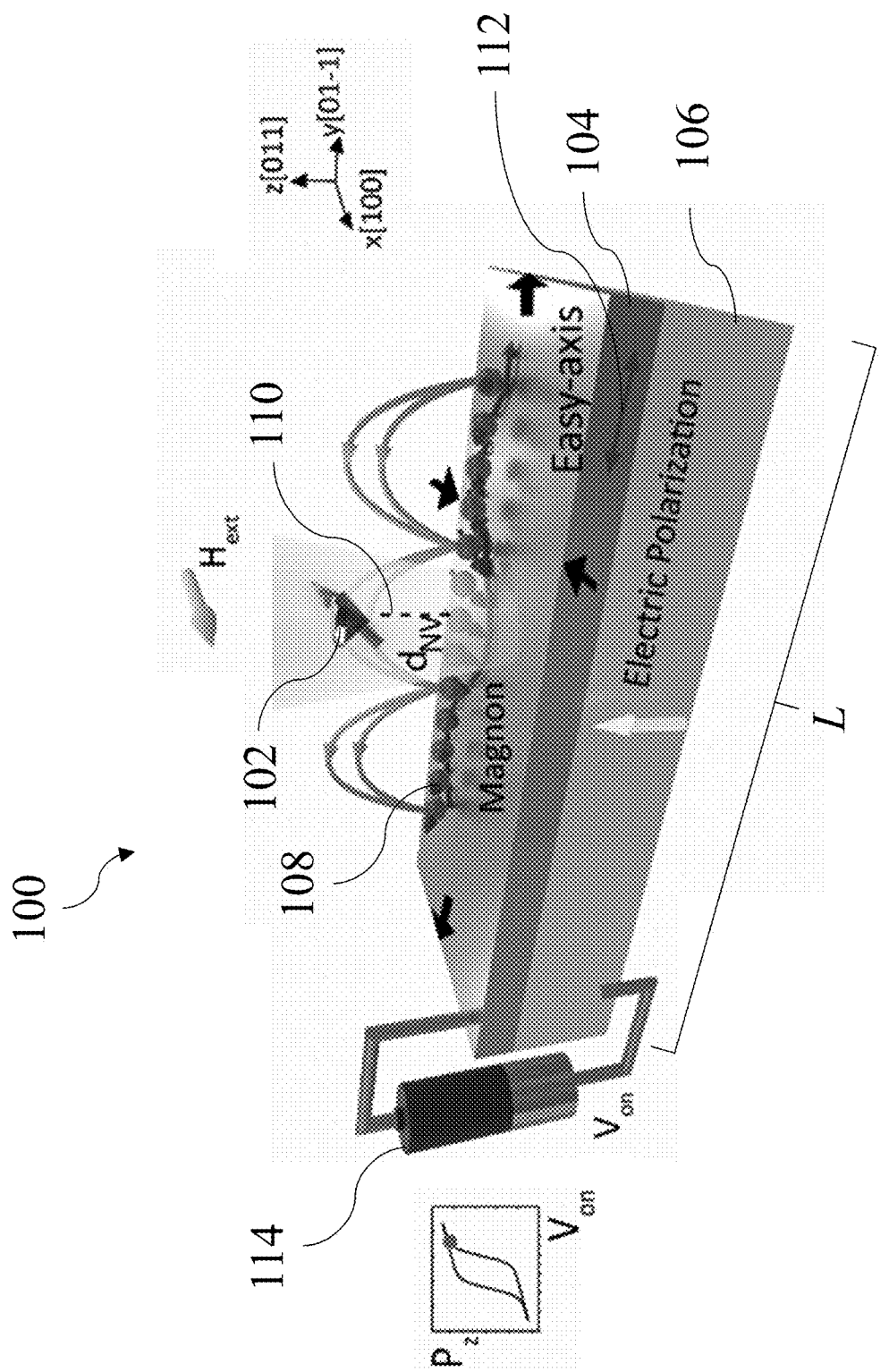
FIG. 2A depicts the nanodevice assembly of FIG. 1A, showing the voltage source providing a voltage signal to a nanodevice, the voltage signal providing a second polarization state.
Figure 2C:
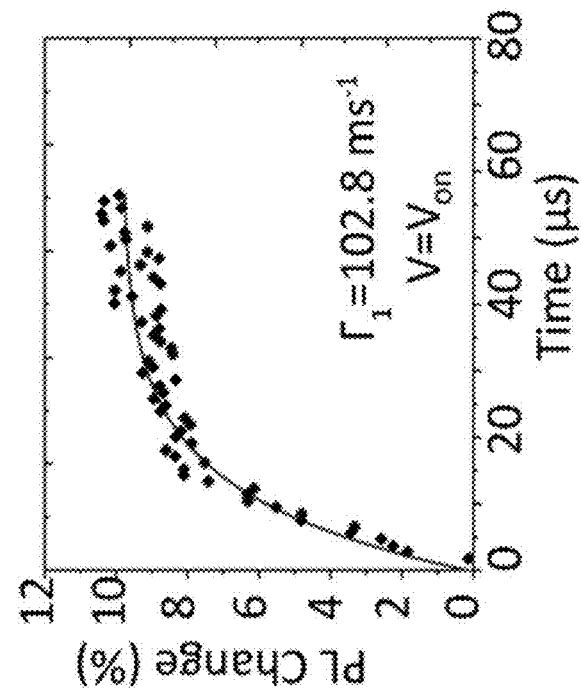
FIG. 2C depicts a graphical representation of experimental results showing the change in relaxation rates of the NV ensemble of the nanodiamond of the nanodevice assembly of FIG. 2A as enabled by electrical tuning of QSD-magnon coupling.
Figure 2B:
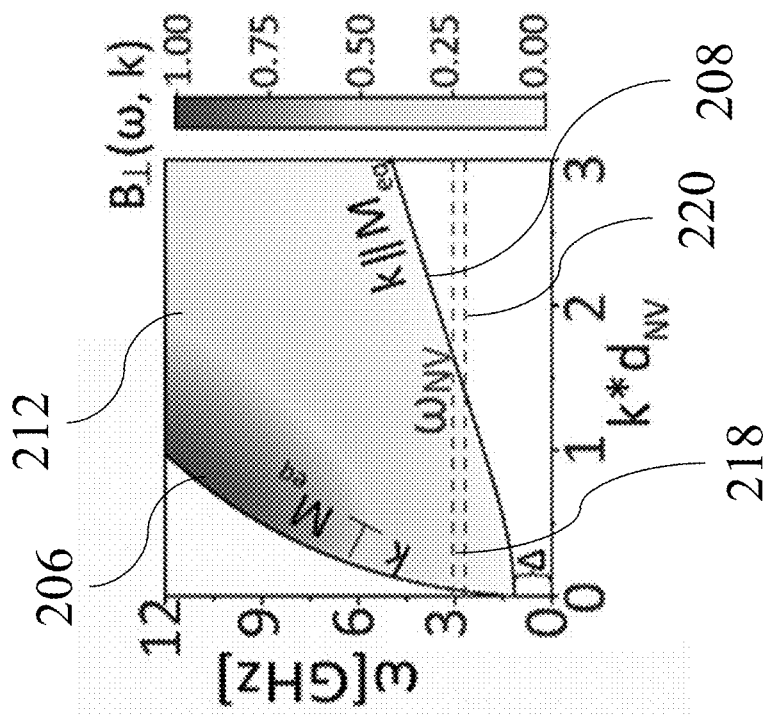
FIG. 2B depicts a graphical representation of experimental results for normalized B⊥(k) as a function of (ω-k) for the nanodevice assembly of FIG. 2A.

Specifically, FIGS. 1B and 2B depicts graphical illustrations of normalized $B_\perp(k)$ as a function of ω-k for both $V_{off}$ and $V_{on}$, respectively. The curves 202, 204, 206, 208) enveloping the gradient areas (210, 212), respectively, are the calculated magnon dispersion lines for bulk modes (k||M) and surface modes ($k_\perp$M). Dashed lines (214, 216, 218, 220) represent the NV ESR lines $\omega_{NV}$. As shown, the magnon dispersion is lowered in frequency w.r.t $\omega_{NV}$ when the voltage is changed from $V_{off}$ to $V_{on}$. $\Delta \equiv \omega_m$ (k=0) is the magnitude of the magnon gap which is measured by FMR experiment as discussed in next section.

Further, the spin relaxometry-based measurements of the thermally populated magnons in CoFeB are of particular interest to demonstrate and quantify the electric-field control of magnon-QSD interaction in these hybrids. The spin state-dependent photoluminescence may be relied upon to measure the relaxation rate of NVs after initializing in the $m_s=0$ state by optical pumping. At room temperature, NV ensembles feature an intrinsic relaxation rate of $\Gamma_0 \approx 3$ [ms]−1 due to electron-phonon interaction and paramagnetic impurities in the vicinity of NVs. The transverse coupling to the thermal magnons can act as a source of additional magnetic noise for the NV spins. This can result in an increased NV spin relaxation rate ($\Gamma_1$), which thus can provide a measure of the transverse coupling. As shown in FIGS. 1C and 2C, it may therefore be demonstrated that, in QSD-magnon hybrids, magnon bands can be moved in and out of resonance with NV ESR transitions via application of the electric field, which can result in approximately 400% tuning of $\Gamma_1$. Further, by lithographically patterning the FM substrate (104) (e.g., CoFeB), this tuning can be improved by nearly three orders of magnitude.

Specifically, FIGS. 1C and 2C depict the change in relaxation rates of the NV ensembles enabled by electrical tuning of QSD-magnon coupling. The measured relaxation rates for a fixed $H_{ext}=57$ G, $\Gamma_1=25.1$ [ms]−1 for $V=V_{off}$ and $\Gamma_1=102.8$ [ms]−1 for $V=V_{on}$. The schematic diagram represents the pulse sequence of the measurement scheme. A green laser (532 nm) of 10 μs is used to initialize the NV ensemble to $m_s=0$ state. The PL signal is measured by a detector pulse of 300 nanosecond width. The entire pulse sequence is repeated $N=10^5$ times for each data point.

Figure 3C:
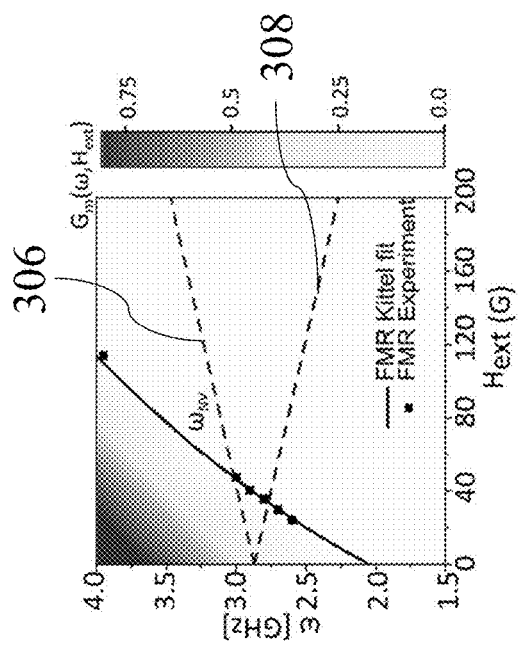
FIG. 3C depicts a graphical representation of experimental results for the ferromagnetic resonance (FMR) frequency ($\omega_m^0$) as a function of external magnetic field $H_{ext}$ fitted with the Kittel formula for 20 nanometer CoFeB film (straight lines) for $H_{ext}$ parallel (x-axis) to the anisotropy field, respectively, of the nanodevice assembly of FIG. 1A.
Figure 3D:
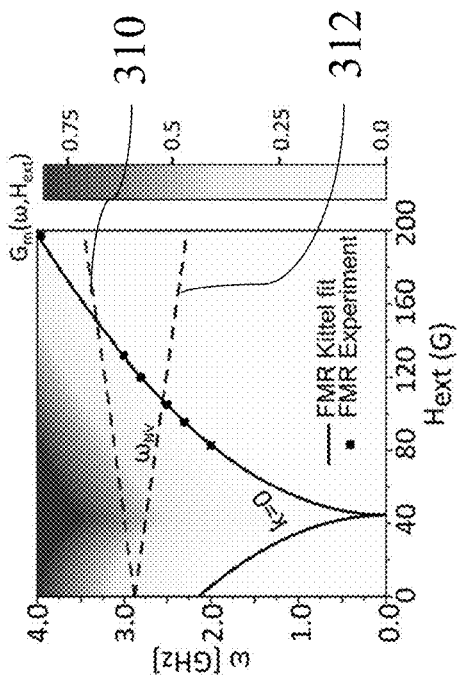
FIG. 3D depicts a graphical representation of experimental results for the ferromagnetic resonance (FMR) frequency ($\omega_m^0$) as a function of external magnetic field $H_{ext}$ fitted with the Kittel formula for 20 nanometer CoFeB film (straight lines) for $H_{ext}$ orthogonal (y-axis) to the anisotropy field, respectively, of the nanodevice assembly of FIG. 1A.
Figure 3A:
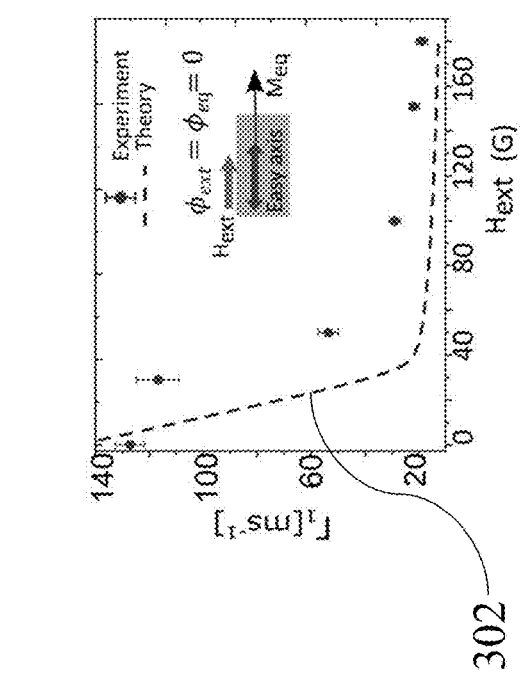
FIG. 3A depicts a graphical representation of experimental results for of the relaxation rate $\Gamma_1$ as a function of external magnetic field $H_{ext}$ parallel (x-axis) to the magnetic anisotropy field (easy-axis), respectively, of the nanodevice assembly of FIG. 1A.
Figure 3B:
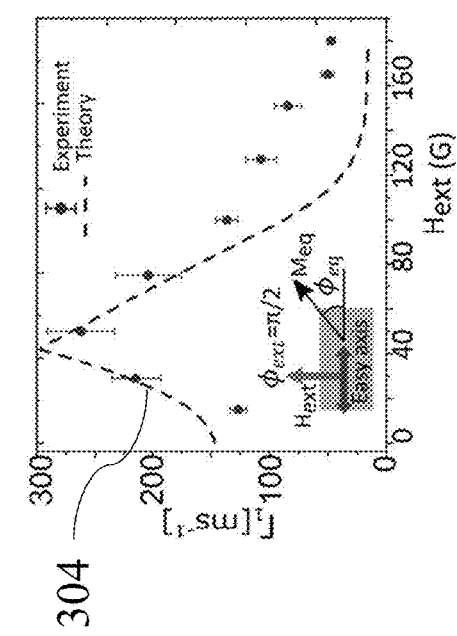
FIG. 3B depicts a graphical representation of experimental results for of the relaxation rate $\Gamma_1$ as a function of external magnetic field orthogonal (y-axis) to the magnetic anisotropy field (easy-axis), respectively, of the nanodevice assembly of FIG. 1A.

II. Quantum Spin Defects and Magnon Interaction in NV, CoFeB, and PMN-PT Hybrids As will be described in greater detail below, FIGS. 3A and 3B depict experimental measurements of the relaxation rate Fi as a function of external magnetic field $H_{ext}$ parallel (x-axis) and orthogonal (y-axis) to the magnetic anisotropy field (easy-axis (112)), respectively. The dashed lines (302, 304) represent theoretical fits of relaxation rates $\Gamma_1$. The inset shows the schematic variation of $H_{ext}$ w.r.t the easy-axis (112) and the direction of equilibrium magnetization. FIGS. 3C and 3D depict experimental measurements of the ferromagnetic resonance (FMR) frequency ($\omega_m^0$) as a function of external magnetic field $H_{ext}$ fitted with the Kittel formula for 20 nm CoFeB film (straight lines) for $H_{ext}$ parallel (x-axis) and orthogonal (y-axis) to the anisotropy field, respectively. Dashed lines (306, 308, 310, 312) represent maximum spread of the NV ESR lines $\omega_{NV}$. Because the experiments utilize a nanodiamond with NV ensemble randomly drop-casted on CoFeB, the directions of NV magnetic dipoles are typically unknown. The gradient graphs of FIGS. 3C and 3D represent the calculated values of the magnetic noise spectral density $G_m$ ($\omega, H_{ext}$) for an effective NV height $d_{NV}$=77 nm.

To reveal the NV-spin magnon coupling and the role of the electric polarization-induced magnetic anisotropy, one may measure the relaxation rate $\Gamma_1$ as a function of $H_{ext}$ for NV/CoFeB/PMN-PT hybrids in the absence of an external electric field. In FIGS. 3A and 3B, $\Gamma_1$ is experimentally measured as a function of $H_{ext}$. FIG. 3A depicts this dependence for $H_{ext}$ applied along the [100] x-axis, while FIG. 3B depicts the same dependence for an $H_{ext}$ applied along the [01-1] y-axis of the (011-cut) PMN-PT. An anisotropic dependence of $\Gamma_1$ is observed on the magnetic field orientation. For the field applied along the x-axis, $\Gamma_1$ decreases monotonically reaching the minimum value of 18.7±2 [ms]−1 for the maximum field $H_{ext}$=180 G. On the other hand, for the field applied along the y-axis, $\Gamma_1$ increases first reaching a maximum value of 262.4±29 [ms]−1 at $H_{ext}$=50 G and then decreases.

This experimental behavior is typically consistent with relaxation of NV-spin due to its coupling to magnons in CoFeB, which has a non-zero magnetic anisotropy along the x-axis. Such uniaxial magnetic anisotropy is no uncommon in hybrid devices due to the residual polarization-induced anisotropic strain within PMN-PT. The relaxation of NV-spins coupled to magnons is governed by the spectral density of magnon-generated transverse field fluctuations evaluated at the NV ESR transitions. The thermally populated modes of the magnetic film $\omega_m$ (k) generate a magnetic noise with the spectral density given by the formula:

$$G_m(\omega) = \int B_\perp^2(k) D[\omega, \omega_m(k)] n[\omega_m(k)] A dk / (2\pi)^2. \quad \text{(``Equation 11'')}.$$

$B_\perp$ represents the magnitude of the transverse magnetic field at the NV due to a magnon occupying the mode with wavevector k, $D = \alpha \omega_m \sqrt{\pi[(\omega - \omega_m)^2 + \alpha^2 \omega_m^2]}$ is the magnon spectral density with $\alpha$ being the Gilbert damping parameter, and $nAdk/2\pi^2$ counts the total number of thermal magnons occupying the states in the neighborhood of k, where A is the area of the film and $n = k_B T / \hbar \omega m$ is the Rayleigh-Jeans distribution function with $k_B$ and T being the Boltzman constant and temperature, respectively. The external magnetic field, by controlling $\omega_m$ (k), can be utilized to tune the spectral density of magnetic noise resonant with the NV ESR transitions. This tuning can result in a characteristic dependence of NV-spin relaxation on field. To understand the observed magnetic field dependence of relaxation, the evolution of magnon spectrum as a function of $H_{ext}$ may be considered.

The magnon spectrum in thin films is described by the dipole-exchange spin waves which can be written in the form $\omega_m(k) = \omega_m^0 + f(k)$. Here, $\omega_m^0$ (Kittel mode) is the band gap at k=0 and f(k) describes the nondegenerate branches of dispersion, which start from $\omega_m^0$ and span a band of frequencies for a given magnitude of k as the angle between k and the equilibrium magnetization is varied from 0 (bulk modes, k∥M) to π/2 radians (surface modes, k⊥M) (see, the magnon bands shown in FIGS. 1A and 2A). To track the location of magnon bands, as shown in FIGS. 3C and 3D, the results of ferromagnetic resonance (FMR) experiments are presented on the multiferroic films, which directly measure $\Omega_m^0$ as a function of $H_{ext}$ along the x and y-axes. Consistent with the relaxometry measurements, w also depends on the orientation of $H_{ext}$, lying at a higher frequency for $H_{ext}$∥x when compared with that for $H_{ext}$∥y. This anisotropic behavior can be described by considering a uniaxial magnetic anisotropy energy of the form $F_{an} = H_k M_s (m_y^2 - m_x^2)/2$ 37 in the magnetic film. $M_s$ is the saturation magnetization, $m_x$ and $m_y$ are the x and y components of the unit vector oriented along the magnetization, and the anisotropy field $H_k$ parameterizes the strength of the uniaxial anisotropy. When $H_k > 0$ ($H_k < 0$), the energy for $m_x = \pm 1$ ($m_y = \pm 1$) is lowered, resulting in the easy axis oriented along the x (y) axis. In such films, $\omega_m^0$ is governed by the orientation of $H_{ext}$ with respect to the easy axis, and is given by the Kittel formula:

$$\omega_m^0 = \gamma \sqrt{H_1 H_2} \quad \text{with} \quad \text{(``Equation 12'')}$$

$$H_1 = H_{ext} \cos(\phi_{ext} - \phi_{eq}) + 2 H_k \cos 2\phi_{eq}$$

and $$H_2 = H_{ext} \cos(\phi_{ext} - \phi_{eq}) + H_k \cos 2\phi_{eq} + 4\pi M_s.$$

$\phi_{ext}$ and $\phi_{eq}$ are the azimuthal angles of the external magnetic field and the equilibrium magnetization, respectively (see, FIGS. 3A and 3B). The Kittel formula shows agreement with the results, whose fits are shown in FIGS. 3C and 3D, and yields the strength of anisotropy field $H_k$=20.35 G with the easy-axis oriented along the x-axis. One important result highlighted by these fits is that due to uniaxial magnetic anisotropy with easy-axis along the x-axis in the FM and FE substrates, for $H_{ext}$ parallel to the x-axis, $\omega_m^0$ and thus the magnon bands shift monotonically to higher frequencies. In contrast, for $H_{ext}$ along the y-axis $\omega_m^0$ and the band frequencies are pulled down first, before raising to higher values.

The following discussion will be regarding the observed anisotropic dependence of $\Gamma_1$ on $H_{ext}$. To this end, in FIGS. 3C and 3D, the (normalized) $G_m$ ($\omega$, $H_{ext}$) is shown as gradients, along with the NV ESR frequencies $\omega_{max}^+$=2.87+ $\gamma H_{ext}$ [GHz] and $\omega_{min}^-$=2.87−$\gamma H_{ext}$ [GHz] for $H_{ext}$ aligned with the NV axis. Due to the random orientation of the nanodiamonds, the magnetic noise frequency probed by ESR transitions for the NV ensembles typically lie between the $\omega_{max}^+$ and $\omega_{min}^-$. It is shown that for $H_{ext}$∥x, the magnetic noise spectral density within $\omega_{max}^+$ and $\omega_{min}^-$ decreases monotonically, consistent with the relaxation rate's decrease with the field. Physically, this behavior primarily results from the fact that, due to the monotonic shift of magnon bands to higher frequency by $H_{ext}$, magnons generating higher $B_\perp$ are pushed away from the frequency range probed by the NV ensemble (see, FIGS. 1B and 2B). Whereas, for $H_{ext}$∥y, since $\omega_m^0$ is first pushed to lower frequencies for $H_{ext}$<50 G before moving to higher frequencies for $H_{ext}$>50 G, magnons with stronger $B_\perp$ are brought into resonance with NV ensemble ESR transitions for $H_{ext}$<50 G or out of resonance with NV ensemble ESR transitions for $H_{ext}$>50 G. Consequently, the spectral density of magnon-generated magnetic noise and the relaxation rates increase with $H_{ext}$ for $H_{ext}$<50 G or decrease with $H_{ext}$>50 G. For a more quantitative comparison, the theoretical best fits of relaxation rate are also shown in FIGS. 3A and 3B exhibiting qualitative agreement with the experimental results. Quantitative differences may arise from neglecting finite mode ellipticity for magnons and/or inclusion of averaging over independently characterized distribution of NV spins and their orientation in the nanodiamond.

III. Electrical Tuning of the QSD-Magnon Interaction

Magnon bands are capable of being moved relative to the NV's ESR transitions by electric field, which is an attractive property offered by the NV/CoFeB/PMN-PT hybrids, to tune the NV-spin magnon interaction. To quantify the electric-field induced movement of magnon bands, one may track $\omega_m^0$, now as a function of the voltage V applied across the multiferroic substrate. To this end, voltage dependent FMR measurements are taken in the presence of a fixed $H_{ext}$ applied along the x-axis. Particularly, as shown in FIG. 4A, $\omega_m^0$ ($H_{ext}$=57 G) for a voltage that is increasing from 50 V to 200 V, along with $H_k$ (V) extracted by applying the Kittel formula on the measured $\omega_m^0$ (V) for V from −200 to 200 V. First, it is noted that $H_k$ (V) inherits the characteristic butterfly-shaped curve for anisotropic strain vs voltage curve as found in similar samples studied in the literature, which is the hallmark of coupled ferroelectric, elastic and magnetic order as the underlying mechanism to electric-field tuning of anisotropy in FM/FE multiferroics. Second, as the voltage is increased from 50 V to 200 V, $H_k$ exhibits a maximal change, decreasing monotonically from $H_k$=30 G at V=50 V and reaching the value of $H_k$=−22 G for V=200 V. It is noted that this maximal change in $H_k$, along with the sign change, corresponds to the flipping of the z-component of electric polarization in the PMN-PT substrate (FM substrate (106)) (see, FIG. 1A). As highlighted above, this behavior is consistent with the rotation of the easy axis (112) (see, FIG. 1A) from x to y due to the flipping of $P_z$. Correspondingly, it is observed that the largest $\omega_m^0$=3.45 GHz when the easy-axis (112) (see, FIG. 1A) is aligned with the direction of $H_{ext}$ for V=50 V. Conversely, $\omega_m^0$ decreases to the minimum value 1.07 GHz when the easy-axis (112) (see, FIG. 1A) is aligned orthogonal to the direction of $H_{ext}$ at V=200 V.

As will be described in greater detail below, FIG. 4A depicts the FMR frequency) ($\omega_m^0$) as a function of applied voltage extracted from the experimental results for a fixed external magnetic field $H_{ext}$=57 G along the x-axis. At V=50 V, designated as $V_{off}$, the electrical polarization in PMN-PT is "down" and the corresponding magnetic anisotropy field is along the x-axis, parallel to $H_{ext}$ resulting in the highest $\omega_m^0$. Conversely, at V=200 V designated as $V_{on}$, the electrical polarization in PMN-PT is "up" and the corresponding magnetic anisotropy field is along the y-axis, orthogonal to $H_{ext}$ resulting in the lowest $\omega_m^0$. The gradient map represents the calculated values of the magnetic noise spectral density $G_m$ ($\omega$,V) for an effective NV height $d_{NV}$=77 nm. The dashed lines (402, 404) represent maximum spread of the NV ESR lines $\omega_{NV}$. The inset (406) shows the detailed measurements of magnetic anisotropy field as a function of applied voltage. One can begin by polling the ferromagnet to (−200 V) and then change the voltage in steps towards +200 V. Following this, the measurement may be performed by changing the voltage in reverse direction from 200 V to −200 V.

More specifically, having the magnon band's location characterized with the voltage dependence, FIG. 4A shows the (normalized) spectral density of magnon-generated magnetic noise as color maps, now in the $\omega$-V plane, which may be calculated by substituting the voltage-dependent magnon spectrum with $H_k$ (V) from the FMR experiments into Eq. 1.1. On the same figure, the NV ESR frequencies are depicted, which lie within the dashed horizontal lines $\omega_{max}^+$ ($H_{ext}$=57 G) (402) and $\omega_{min}^-$ ($H_{ext}$=57 G) (404). In contrast to the magnetic field tuning, the voltage does not typically affect the NV ESR transitions, but typically only moves the magnon bands. Focusing on the spectral density of magnetic noise within the range probed by NV ensembles the following behavior may be expected: for V=50 V, i.e. when $P_z$ points downward, $H_k$ is positive and the largest $\omega_m^0$=3.45 GHz for the NV/CoFeB/PMN-PT hybrids lies above the NV transition frequency (shown in FIG. 4A) so that the magnon bands are off-resonant with NVs (as shown in FIG. 1A, where V=50 V is referred to as $V_{off}$). Consequently, magnons may be expected to couple weakly with NV (e.g., via the spectral widths of the magnon modes), which is reflected in the calculated $G_m$ within $\omega_{max}^+$ and $\omega_{min}^-$ band, having a relatively low value at V=50 V. As the voltage is increased, because of the polarization reorientation-induced monotonic decrease in $H_k$ and $\omega_m^0$, magnons with stronger dipole fields are brought into the resonance with the NV ESR transitions (see, FIG. 1A) and as a result they are gradually turning on the stronger interaction between NV spins and magnons. This is reflected in $G_m$ increasing monotonically and reaching the maximum value within the frequency range spanned by $\omega_{max}^+$ and $\omega_{min}^-$ for V=200 V. Thus, V=200 V is referred to as $V_{on}$. Therefore, the relaxation rate is expected to increase monotonically with voltage increasing from $V_{off}$ to $V_{on}$.

Figure 4B:
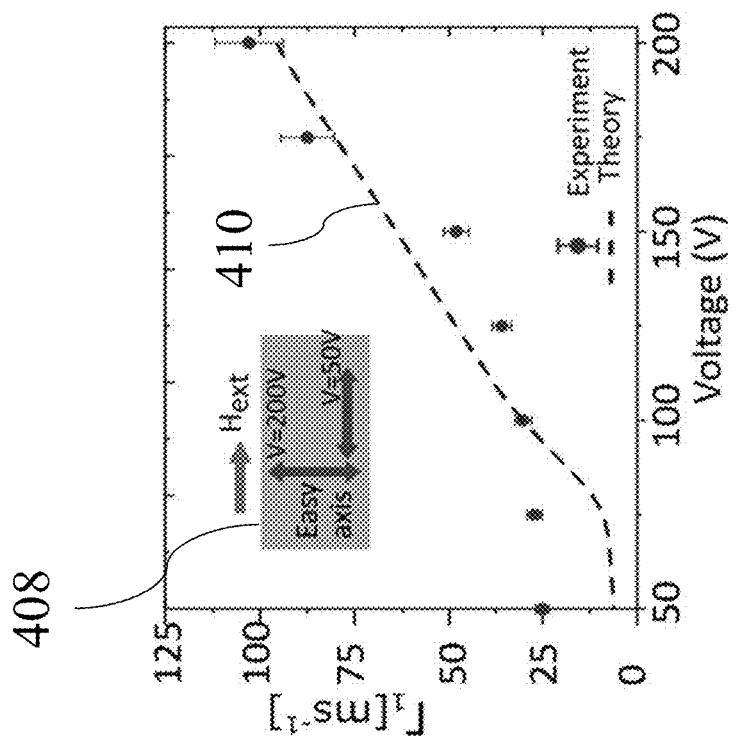
FIG. 4B depicts a graphical representation of experimental results of one exemplary experiment, showing measured relaxation rates $\Gamma_1$ as a function of applied voltage for a fixed external magnetic field $H_{ext}$=57 G.
Figure 4A:
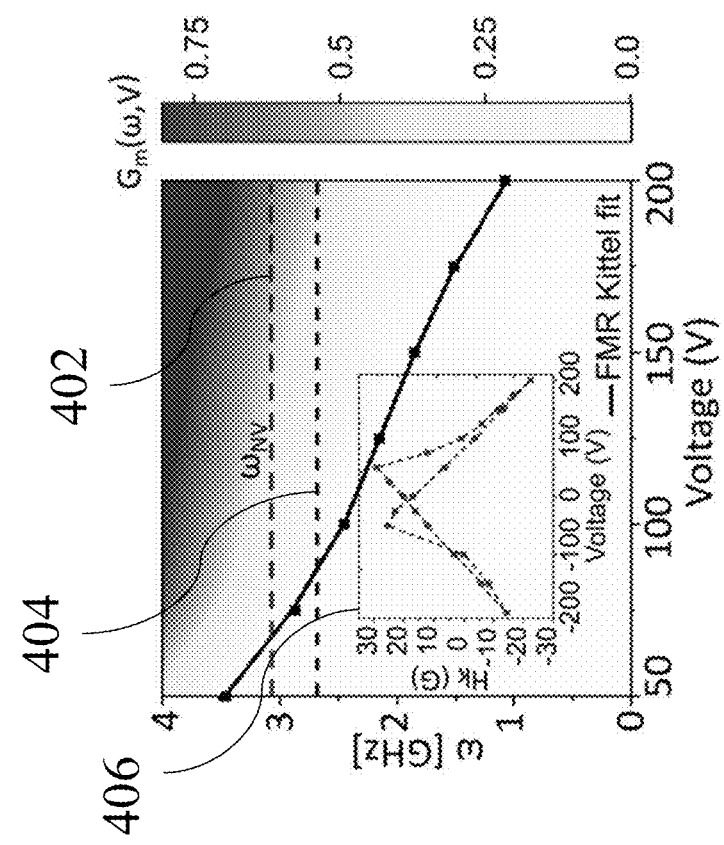
FIG. 4A depicts a graphical representation of experimental results of one exemplary experiment, showing an FMR frequency ($\omega_m^0$) as a function of applied voltage for a fixed external magnetic field $H_{ext}$=57 G.

As will be described in greater detail below, depicted in FIG. 4B are measured relaxation rates $\Gamma_1$ as a function of applied voltage for a fixed $H_{ext}$=57 G along the x-axis. The inset (408) shows a schematic illustration of magnetic anisotropy field for the two different voltages for a fixed $H_{ext}$. The dashed line (410) represents theoretical fit of relaxation rates $\Gamma_1$.

More specifically, the experimental results of relaxation rates measured as a function of the voltage, as shown in FIG. 4B, illustrate agreement with the above-discussed qualitative picture. Namely, the lowest relaxation rate of 25.1±2 [ms]−1 is observed for V=$V_{off}$ (with the corresponding photoluminescence curve shown in FIG. 1C). This rate monotonically increases to 102.8±9 [ms]−1 at V=$V_{on}$ (with the corresponding photoluminescence curves shown in FIG. 2C). Finally, the results are plotted of theoretical $\Gamma_1$ fits for the NV ensembles, with the nanodiamond orientation kept at a value found in the previous section, finding that the theoretical fits are also in reasonable quantitative agreement with the experiments. In addition to the reasons pointed out for FIGS. 3A and 3B, the quantitative difference between experiment and theory in this case may arise from the presence of ferroelectric domains due to domain-nucleation mechanism of ferroelectric switching. This would make the functional form of $\Gamma_1$ (V) dependent on the location of nanodiamond and/or affect the magnon spectrum by introducing local scattering potentials. Extending the present measurements to NV-scanning geometry could address this issue.

Figure 5:
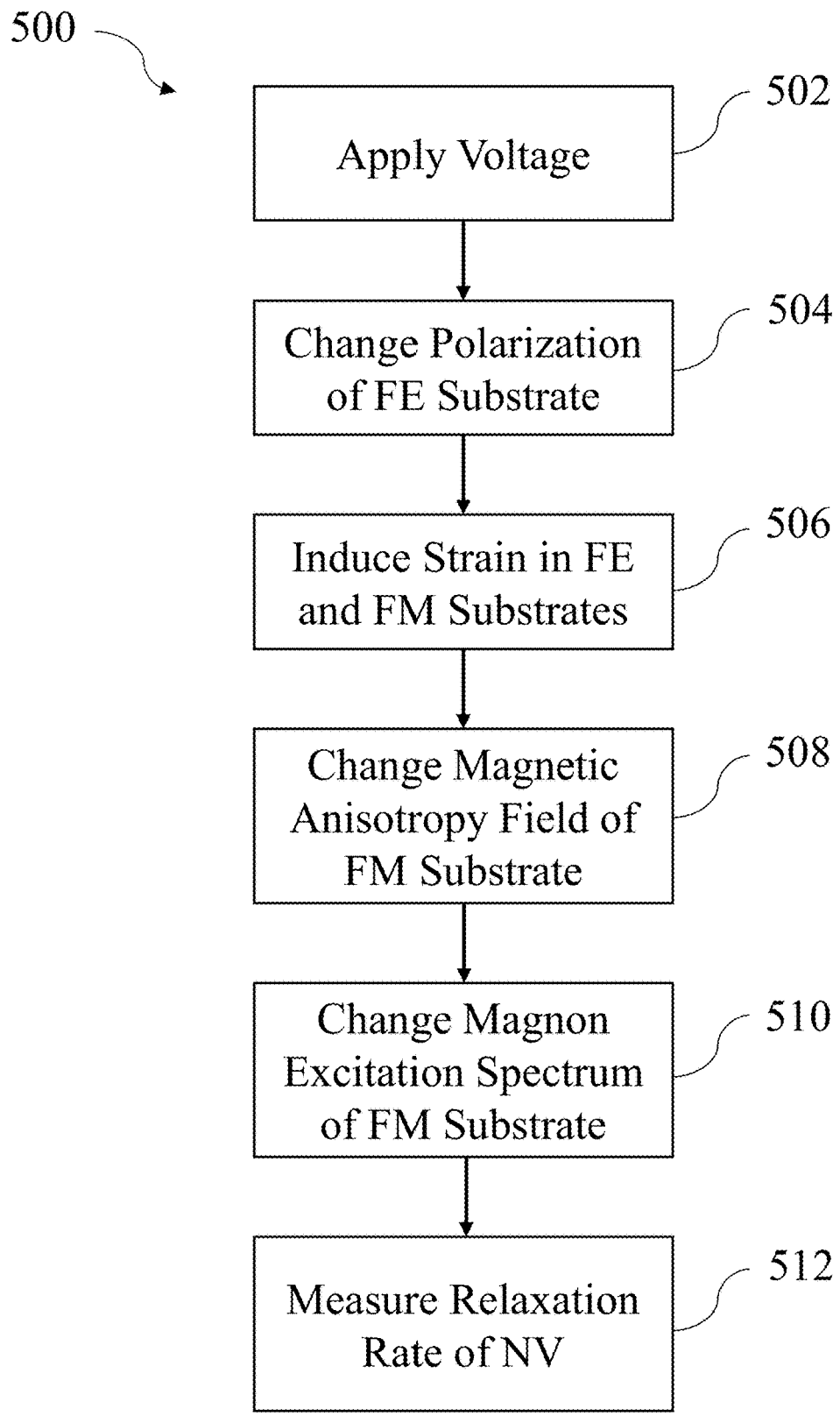
FIG. 5 depicts a flowchart of one exemplary method of using a nanodevice.

Depicted in FIG. 5 is one exemplary method (500) of using a nanodevice as described herein to measure an electric field. At step (502), a voltage may be applied across a ferroelectric substrate and a ferromagnetic material, such as those described herein with reference to FIGS. 1A and 2A, using a power signal from a voltage source. The electric field to be measured may be, for example, an electric field created by the applied voltage. The ferromagnetic material may be disposed over the ferroelectric substrate, or otherwise position adjacent to the ferroelectric substrate such as to permit the interactions as described herein. At step (504), the electric field may be configured to change the electric polarization of the ferroelectric substrate and thereafter, at step (506), induce a strain in the ferroelectric substrate and a ferromagnetic material. As such, at step (508), the magnetic anisotropy field of the ferromagnetic material may be changed via the interaction with the ferroelectric substrate. At step (510), the magnon excitation spectrum of the ferromagnetic material may be configured such that it changes with respect to an electron spin resonance (ESR) frequency of the NV ensemble inside the nanodiamond. In some exemplary nanodevice assemblies, the nanodiamond is disposed over, or otherwise adjacent to, the ferromagnetic material such that the NV ensembles are affected by the interaction with the magnon excitation spectrum. At step (512), the relaxation rate of the NV ensembles may be measured to, among other things, determine the electric field.

IV. General Discussion

The demonstrated electric field control can have important implications for engineering electrically tunable quantum spintronic devices. Particularly, the observed shift in NV's relaxation rates, $\Gamma_1$ can be exploited for sensing electric fields ("magnon-sensing"). This is in contrast with the sensing schemes using shift in NV's ESR splitting, $\omega_{NV}$, due to their direct coupling with the electric field ("direct-sensing"). The sensitivity of both magnon and direct sensing schemes scales as $S \propto 1/\eta\sqrt{T_\chi}$. Here, $\eta$ is the transduction parameter, which for the magnon-sensing is given by $\eta_m = \partial\Gamma/\partial E$ and for direct-sensing is given by $\eta_d = \partial\omega/\partial E$, and $T_\chi$ is the time scale before which unwanted signals decoheres or relaxes the NV-spin. For direct-sensing, $\eta_d \sim 28$ Hz/V/cm is set by the Stark shift and $T_\chi \sim$ ms is the NV's decoherence, which yields photon shot noise-limited single-spin DC field sensitivities $S_d \sim 890$ V/cm/$\sqrt{Hz}$. From the high voltage bias region shown in FIG. 4B, for the present experiments, $\eta_m \sim 15$ Hz/V/cm and $T_\chi = 1/\Gamma \sim 10$ μs. This suggests that, for the parameter regime studied, the sensitivity of the magnon-sensing scheme $S_m$, is an order of magnitude bigger than $S_d$. However, highlighted next, since $\eta_m$ is not limited by the weak Stark shifts, $S_m$ can be enhanced by several orders of magnitude by proper design of the ferromagnet.

The transduction parameter for magnon-sensing can be written as $\eta_m = v\beta$ where $\beta \equiv \partial\omega_m/\partial E$ parameterizes the shift in magnon modes due to the electric field, and the dimensionless factor $v \equiv \partial\Gamma/\partial\omega_m$ represents the change in the NV-relaxation rate corresponding to the shift of magnon modes. $\beta$ is governed by the piezoelectric and magneto-elastic properties of the CoFeB/PMN-PT substrate stack, which can be read from FIG. 4A to be ~MHz/V/cm (i.e., about six orders of magnitude larger than $\eta_d$). Relatively small (~Hz/V/cm) values of $\eta_m$ in the present NV/CoFeB/PMN-PT hybrids then arise from $v \ll 1$, which physically corresponds to the fact that a broad band of magnons need to be moved before NV and magnons become off-resonant (see, FIGS. 1B and 2B), resulting in slow variation of $\Gamma_1$. In nanoscale magnets (instead of substrates which are formed to resemble films), the magnon modes are often discretized due to confinement. Consequently, a much smaller shift in the magnon frequency ($\sim \alpha\omega_m^0$, for example, for NV coupled to the Kittel mode) could make the magnon mode and the NV ESR off-resonant, hence enhancing v. Informed by these heuristics, $S_m$ can be calculated for the recently demonstrated V[TCNE]x/PMN-PT hybrids, showing minimum sensitivity $S_m \sim 0.5$ V/cm/$\sqrt{Hz}$ for typical photoluminescence readout efficiency C=0.3. Even further improvement in $S_m$ would occur via enhancing $\beta$ by choosing magnets with larger magneto-elastic coefficients (such as Terfanol-D, having up to 20x larger coefficient than CoFeB) and/or lower Gilbert damping (such as YIG, V[TCNE]2, with 3-order lower a than CoFeB). Furthermore, at the heart of the described scheme is the electrical tuning of the magnon spectrum, which is not limited to ferromagnet/ferroelectric heterostructures discussed herein; it could also leverage various other mechanisms for electric field control of magnetism, such as voltage control of interfacial magnetic anisotropy and magneto-ionic effect to enhance $\beta$. Finally, it is noted that the predicted improved sensitivity via magnons agrees with the general strategy of using hybridization of NV with magnets to improve thermal, magnetic field, electric field and pressure sensing.

On another front, the relaxometry data described herein shows that the QSD relaxation can be used as a noninvasive probe of ferroelectric state and local strain via its effect on magnons, thus adding multiferroics to the family of condensed matter systems (e.g. metals, magnets, and superconductors) that can leverage the noninvasiveness, high spatial, and temporal resolution of NV-magnetometry to probe and advance multiferroic-based functional devices. Beyond sensing, an array of QSD/nano-FM/FE hybrids could provide a novel approach to build scalable QSD-based quantum circuits. In such circuits, a weak global microwave would coherently drive only desired QSD qubits, whose proximal nano-FM are tuned in resonance with the microwave by local gates4, while a tunable transfer of information between QSD qubits can be engineered by controlling the coupling between neighboring nanomagnets by tuning their relative frequencies electrically.

We claim:

1. A nanodevice, comprising:
   (a) a ferroelectric substrate;
   (b) a ferromagnetic material disposed over the ferroelectric substrate;
   (c) a nanodiamond including an ensemble of nitrogen-vacancy (NV) spins, wherein each NV is configured to magnetically interface with one or more magnons of the ferromagnetic material to form one or more NV spin-magnon interactions; and
   (d) a voltage source coupled with the ferroelectric substrate and the ferromagnetic material, wherein the voltage source is configured to provide a voltage signal across the ferroelectric substrate and the ferromagnetic material, wherein the voltage signal is selectively tunable to adjust the one or more NV spin-magnon interactions.

2. The nanodevice of claim 1, wherein the voltage source includes a positive terminal and a negative terminal, wherein the positive terminal is coupled with the ferroelectric substrate, wherein the negative terminal is coupled with the ferromagnetic material.

3. The nanodevice of claim 1, wherein the voltage signal is operable to induce a strain in the ferroelectric substrate and in the ferromagnetic material.

4. The nanodevice of claim 1, wherein the voltage signal is operable to alter a magnetic anisotropy field of the ferromagnetic material.

5. The nanodevice of claim 1, wherein the voltage signal is operable to alter a magnon excitation spectrum of the ferromagnetic material with respect to an electron spin resonance (ESR) frequency of the ensemble of NV spins.

6. The nanodevice of claim 1, wherein the ferromagnetic material includes at least one of Cobalt Iron Boron (CoFeB), Yttrium Iron Garnet (YIG), Terfanol-D, Nickel (Ni), Iron (Fe), or Nickel Iron (NiFe).

7. The nanodevice of claim 1, wherein the nanodiamond is sized at approximately 70 nanometers in all dimensions.

8. The nanodevice of claim 1, wherein the ferroelectric substrate includes at least one of Lead magnesium Niobate-Lead titanate solution $((1-x)[Pb(Mg_{1/3}Nb_{2/3})O_3]-x[PbTiO_3]$ also known as PMN-PT), Lead Zirconate Titanate $((Pb[Zr(x)Ti(1-x)]O_3)$ also known as PZT), Bismuth Ferrite $(BiFeO_3)$, Barium Titanate $(BaTiO_3)$, or Magnesium Oxide (MgO).

9. The nanodevice of claim 1, wherein the nanodiamond is disposed over the ferromagnetic material.

10. The nanodevice of claim 1, wherein the voltage signal is operable to change an electric polarization of the ferroelectric substrate.

11. A nanodevice, comprising:
(a) a ferroelectric substrate including at least one of Lead magnesium Niobate-Lead titanate solution $((1-x)[Pb(Mg_{1/3}Nb_{2/3})O_3]-x[PbTiO_3]$ also known as PMN-PT), Lead Zirconate Titanate $((Pb[Zr(x)Ti(1-x)]O_3)$ also known as PZT), Bismuth Ferrite $(BiFeO_3)$, Barium Titanate $(BaTiO_3)$, or Magnesium Oxide (MgO);
(b) a ferromagnetic material disposed over the ferroelectric substrate, wherein the ferromagnetic material includes at least one of: Cobalt Iron Boron (CoFeB), Yttrium Iron Garnet (YIG), Terfanol-D, Nickel (Ni), Iron (Fe), V[TCNE]x or Nickel Iron (NiFe); and
(c) a nanomaterial positioned adjacent to the ferromagnetic material, wherein the nanomaterial includes an ensemble of quantum spin defects (QSDs), wherein each QSD is configured to magnetically interface with one or more magnons of the ferromagnetic material to form one or more QSD-magnon interactions; and
(d) a voltage source coupled with the ferroelectric substrate and the ferromagnetic material, wherein the voltage source is selectively operable to provide a voltage signal operable to alter the one or more QSD-magnon interactions.

12. The nanodevice of claim 11, wherein a positive terminal of the voltage source is coupled with the ferroelectric substrate and a negative terminal of the voltage source is coupled with the ferromagnetic material.

13. The nanodevice of claim 11, wherein the nanomaterial is approximately 70 nanometers (nm) in all dimensions.

14. A method of using a nanodevice to measure an electric field, wherein the nanodevice a ferroelectric substrate, a ferromagnetic material disposed over the ferroelectric substrate, and a nanodiamond including an ensemble of nitrogen-vacancy (NV) spins, wherein the nanodiamond is positioned adjacent to the ferromagnetic material, the method comprising:

(a) applying a voltage across the ferroelectric substrate and the ferromagnetic material, wherein the ferromagnetic material is positioned adjacent to the ferroelectric substrate;
(b) upon applying the voltage across the ferroelectric substrate and the ferromagnetic material, changing a magnon excitation spectrum of the ferromagnetic material with respect to an electron spin resonance frequency of the ensemble of NV spins; and
(c) measuring a relaxation rate of the of the ensemble of NV spins to determine the electric field.

15. The method of claim 14, further comprising:
upon applying the voltage across the ferroelectric substrate and the ferromagnetic material, changing a magnetic anisotropy field of the ferromagnetic material to thereby change the magnon excitation spectrum of the ferromagnetic material.

16. The method of claim 15, further comprising:
upon applying the voltage across the ferroelectric substrate and the ferromagnetic material, inducing a strain in the ferroelectric substrate and the ferromagnetic material to thereby change the magnetic anisotropy field of the ferromagnetic material.

17. The method of claim 16, further comprising:
upon applying the voltage across the ferroelectric substrate and the ferromagnetic material, changing an electric polarization of the ferroelectric substrate via the voltage to thereby induce the strain in the ferroelectric substrate and the ferromagnetic material.

18. The method of claim 14, wherein the nanodevice includes a voltage source coupled with the ferroelectric substrate and the ferromagnetic material, wherein the voltage source applies the voltage across the ferroelectric substrate and the ferromagnetic material.

19. The method of claim 14, wherein the ferroelectric substrate comprises at least one of: Lead magnesium Niobate-Lead titanate solution $((1-x)[Pb(Mg_{1/3}Nb_{2/3})O_3]-x[PbTiO_3]$ also known as PMN-PT), Lead Zirconate Titanate $((Pb[Zr(x)Ti(1-x)]O_3)$ also known as PZT), Bismuth Ferrite $(BiFeO_3)$, Barium Titanate $(BaTiO_3)$, or Magnesium Oxide (MgO).

20. The method of claim 14, wherein the ferromagnetic material comprises at least one of: Cobalt Iron Boron (CoFeB), Yttrium Iron Garnet (YIG), Terfanol-D, Nickel (Ni), Iron (Fe), V[TCNE]x or Nickel Iron (NiFe).

\* \* \* \* \*